United States Patent
Lee et al.

(10) Patent No.: US 8,035,933 B2
(45) Date of Patent: Oct. 11, 2011

(54) STRUCTURE OF PERSISTENT CURRENT SWITCH AND THAT OF CONTROL METHOD

(75) Inventors: Hee-Gyoun Lee, Seoul (KR); Gye-Won Hong, Seongnam-si (KR); Kyeong Dal Choi, Seoul (KR); Seung Wook Lee, Ansan-si (KR)

(73) Assignee: Korea Polytechnic University Industry Academic Cooperation Foundation, Siheung-si (KR)

( * ) Notice: Subject to any disclaimer, the term of this patent is extended or adjusted under 35 U.S.C. 154(b) by 136 days.

(21) Appl. No.: 12/444,176

(22) PCT Filed: Oct. 10, 2007

(86) PCT No.: PCT/KR2007/004931
§ 371 (c)(1),
(2), (4) Date: Apr. 29, 2009

(87) PCT Pub. No.: WO2008/044863
PCT Pub. Date: Apr. 17, 2008

(65) Prior Publication Data
US 2009/0314617 A1    Dec. 24, 2009

(30) Foreign Application Priority Data

Oct. 10, 2006    (KR) .................. 10-2006-0098206

(51) Int. Cl.
  *H01L 39/24* (2006.01)
(52) U.S. Cl. .......................................... 361/19; 505/124
(58) Field of Classification Search ............... 361/19; 505/124
  See application file for complete search history.

(56) References Cited

U.S. PATENT DOCUMENTS

| | | | | |
|---|---|---|---|---|
| 3,021,434 A | * | 2/1962 | Blumberg | 327/371 |
| 4,797,510 A | * | 1/1989 | Mihelich | 505/230 |
| 6,531,233 B1 | * | 3/2003 | Pourrahimi et al. | 428/615 |

* cited by examiner

*Primary Examiner* — Danny Nguyen
(74) *Attorney, Agent, or Firm* — NSIP Law

(57) ABSTRACT

Disclosed is the structure of a persistent current switch and a control method for the same. In the switch structure, a portion of a superconducting wire to be used as a switch is formed with slits such that the flow of current is controlled by the switch, to facilitate a transition between the superconducting state and the normal state of the superconducting wire. The structure of the persistent current switch includes a first slit longitudinally extending from a first point on one end of a superconducting wire to a second point and from a third point to a fourth point, the second, third, and fourth points being arranged sequentially in a longitudinal line, and second and third slits provided at opposite sides of a region between the second point and the third point where no first slit exists.

4 Claims, 8 Drawing Sheets

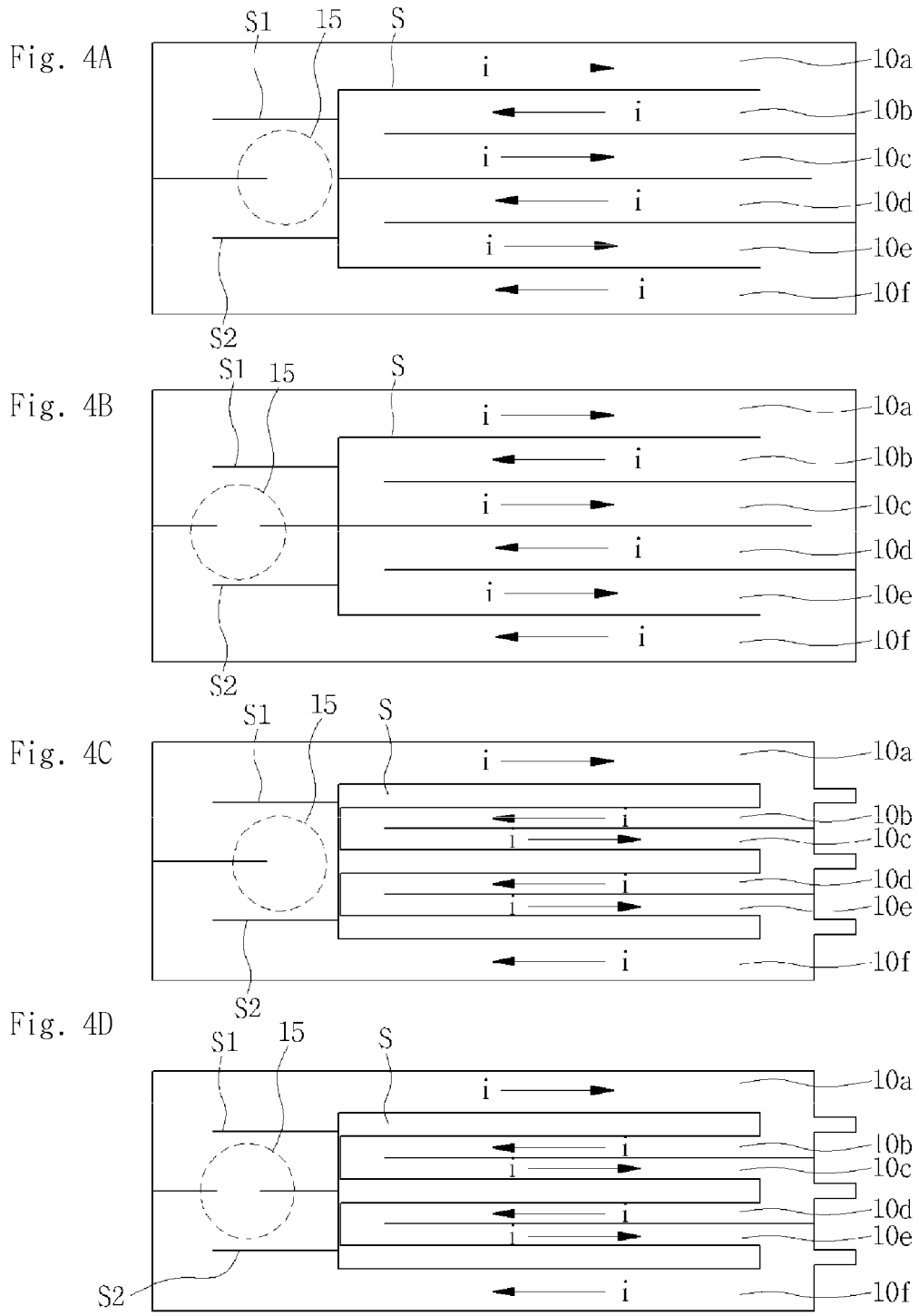

STRUCTURE OF PERSISTENT CURRENT SWITCH AND THAT OF CONTROL METHOD

TECHNICAL FIELD

The present invention relates to the structure of a persistent current switch and a control method for the same, and more particularly, to the structure of a persistent current switch, in which a portion of a superconducting wire to be used as a switch is formed with slits and the flow of current is controlled by use of the switch formed with the slits to facilitate a transition between the superconducting state and the normal conducting state of the superconducting wire, and a control method for the same.

BACKGROUND ART

Superconductivity is the phenomenon that the electric resistance of materials disappears when temperature of the substance is decreased lower than its critical transition temperature. Using superconductive materials can cause the flow of electric current without the generation of heat, and prevent the loss of electrical energy. The superconductive materials are called "superconductors". The superconductors can cause the flow of electric current without a resistance only below a superconducting transition temperature Tc and a critical magnetic field Hc. In this case, there exists a critical current density Jc as the maximum conducting current density for allowing the flow of electric current without a resistance.

As application examples of the superconductors, superconducting electromagnets have been widely used. The superconducting electromagnets are processed to have a wire or tape shape and serve to produce a high magnetic field. The electromagnets are fabricated by winding wires to form several geometrical shapes of coils. The coils produce a magnetic field when electric current flows through the wires. If the wires are superconductors, there is no loss of electric power due to a resistance.

The superconducting electromagnet is used for Magnetic Resonance Imaging (MRI) and Nuclear Magnetic Resonance (NMR) equipments, etc. These equipments require a uniform and stable magnetic field in order to exhibit desired characteristics thereof. To produce the uniform and stable magnetic field, it is necessary to achieve a superconductive bonding between ends of the superconducting coil, so as to form a closed-loop superconducting electromagnet having a persistent current operation mode. Under the assumption of an ideal superconductive bonding, conducting current can flow through the electromagnet or bonding points without the loss of energy due to an electrical resistance. Further, a uniform magnetic field can be produced from the electromagnet, and the superconducting magnet can operate in the persistent current mode to maintain a desired magnetic field in a uniform and stable state.

FIG. 1 illustrates a conventional superconducting magnet for the persistent current mode. More specifically, FIG. 1A illustrates a superconducting wire 10, which has a slit S to divide the superconducting wire 10 into a first wire 10a and a second wire 10b. Referring to FIG. 1B, the first wire 10a and the second wire 10b of the superconducting wire 10 are wound on bobbins 25, respectively, and one end of each wire 10a or 10b is connected to a power supply 40 by means of a current-inlet line 41 to receive current (i) supplied from the power supply 40. If the overall superconducting magnet is cooled, the superconducting wire 10 becomes a superconducting state. Then, as a portion of the superconducting wire 10, which is designated by reference numeral 60 in FIG. 1B, is heated by a heater 50, the portion 60 of the superconducting wire 10 is changed from the superconducting state to a normal conducting state. In this state, the current (i) being supplied from the power supply 40 flows through the first wire 10a and the second wire 10b, and magnetic field are produced around the bobbins 25. The portion 60 of the superconducting wire 10 is again changed from the normal conducting state to the superconducting state if the heater 50 is switched off, and the superconducting wire 10 constituting the two coils forms a closed loop. Since the superconducting wire 10, consisting of the two wires 10a and 10b, has no resistance, the superconducting wire 10 can be operated in the persistent current mode In the persistent current mode, the current (i) continuously flows even if no further current (i) is supplied from the external source, and the magnetic fields can be kept continuously.

FIG. 1C is a view illustrating the flow of current (i). If a portion of a superconducting wire, which is designated by symbol ⓖ in FIG. 1C, is heated by a heater, the portion ⓖ becomes the normal conducting state, but other portions ⓑ, ⓒ, ⓓ, ⓔ and ⓕ of the superconducting wire remain in superconducting state. In this case, the current (i) flows in the course of ⓐ→ⓑ→ⓒ→ⓓ→ⓔ→ⓕ→ⓗ. Then, the heating of the portion ⓖ is stopped, the portion ⓖ is changed to the superconducting state, to form a superconductive closed loop. In this state, the current (i) continuously flows in the course of ⓑ→ⓒ→ⓓ→ⓔ→ⓕ→ⓖ. When the overall superconducting wire being changed to the superconducting state, there is no resistance. Therefore, the current can flow continuously through the superconducting wire, even if the supply of current (i) is stopped and thereby maintaining a magnetic field in a stable state.

However, in the above described conventional art, one end of the superconducting wire 10 is wholly heated by the heater 50, and thus results in the loss of a refrigerant. Further, since the end of the superconducting wire 10 has no slit, the superconducting wire 10 has a difficulty in the connection of the power supply 40.

In the following description, the same reference numbers will be used to refer to the same parts as the conventional art.

DISCLOSURE

Technical Problem

Therefore, the present invention has been made in view of the above problems, and it is an object of the present invention to provide the structure of a persistent current switch, in which an end portion of a superconducting wire to be used as a switch is formed with a slit to facilitate a transition between the superconducting state and the normal state of the superconducting wire by controlling the flow of current through the superconducting wire, the superconducting wire using the switch formed with the slit being easily changed from the superconducting state to the normal conducting state even by slight heat and in an actual use thereof, being capable of reducing thermal load to be applied to a cooling system and assuring easy regulation in the position of the superconducting switch, and a control method for the same.

Technical Solution

In accordance with an aspect of the present invention, the above and other objects can be accomplished by the provision of a structure of a persistent current switch comprising: a first slit longitudinally extending from a first point E1 on one end of a superconducting wire to a second point E2 and from a third point E3 to a fourth point E4, the second, third, and fourth points E2, E3, E4 being arranged sequentially in a longitudinal line; and second and third slits provided at opposite sides of a region between the second point E2 and the third point E3 where no first slit exists, the second and third slits having a length longer than a distance between the second point E2 and the third point E3.

In accordance with another aspect of the present invention, there is provided a control method for a persistent current switch comprising: introducing a superconducting wire having a persistent current switch into a refrigerant, the persistent current switch of the superconducting wire including a first slit longitudinally extending from a first point E1 on one end of a superconducting wire to a second point E2 and from a third point E3 to a fourth point E4, the second, third, and fourth points E2, E3, E4 being arranged sequentially in a longitudinal line, and second and third slits provided at opposite sides of a region between the second point E2 and the third point E3 where no first slit exists, the second and third slits having a length longer than a distance between the second point E2 and the third point E3; heating the switch of the superconducting wire introduced into the refrigerant or separating the switch from the refrigerant, to change the superconducting wire into a normal conducting state; supplying power to the first point E1 as a starting point of the first slit formed in the superconducting wire, to apply current throughout the superconducting wire; stopping the heating of the switch of the superconducting wire or again introducing the switch of the superconducting wire into the refrigerant; and stopping the supply of power to the superconducting wire, to allow the superconducting wire to operate in a persistent current mode so as to maintain a magnetic field.

In the normal conducting S20 state of the superconducting wire obtained by heating the switch or separating the switch from the refrigerant, current may flow from a power supply to the superconducting wire in the sequence of ①→②→③→④→⑤→⑥→⑦, and then, returns to the power supply.

In the operation state S50 of stopping the supply of power and maintaining the magnetic field, current may flow through the superconducting wire in the sequence of ③→④→⑤→⑧→⑨→⑩.

Advantageous Effects

According to the present invention, to facilitate a transition between the superconducting state and the normal conducting state of a superconducting wire by controlling the flow of current through the superconducting wire, the superconducting wire is formed, at an end portion thereof to be used as a switch, with a slit. The superconducting wire using a switch formed with the slit can be changed from the superconducting state to the normal conducting state even by slight heat. Accordingly, in an actual use thereof, the thermal load to be applied to a cooling system can be reduced, and assure easy regulation in the position of the superconducting switch.

DESCRIPTION OF DRAWINGS

The above and other objects, features and other advantages of the present invention will be more clearly understood from the following detailed description taken in conjunction with the accompanying drawings, in which:

FIG. 4 is a view illustrating various shapes of the persistent current switch according to the present invention;

MODE FOR INVENTION

Figure 1A:
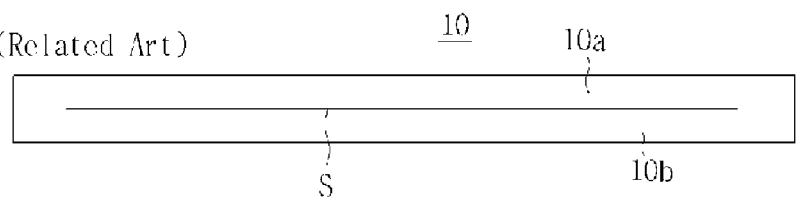
FIG. 1 is a view illustrating a conventional superconducting magnet for persistent current.
Figure 1B:
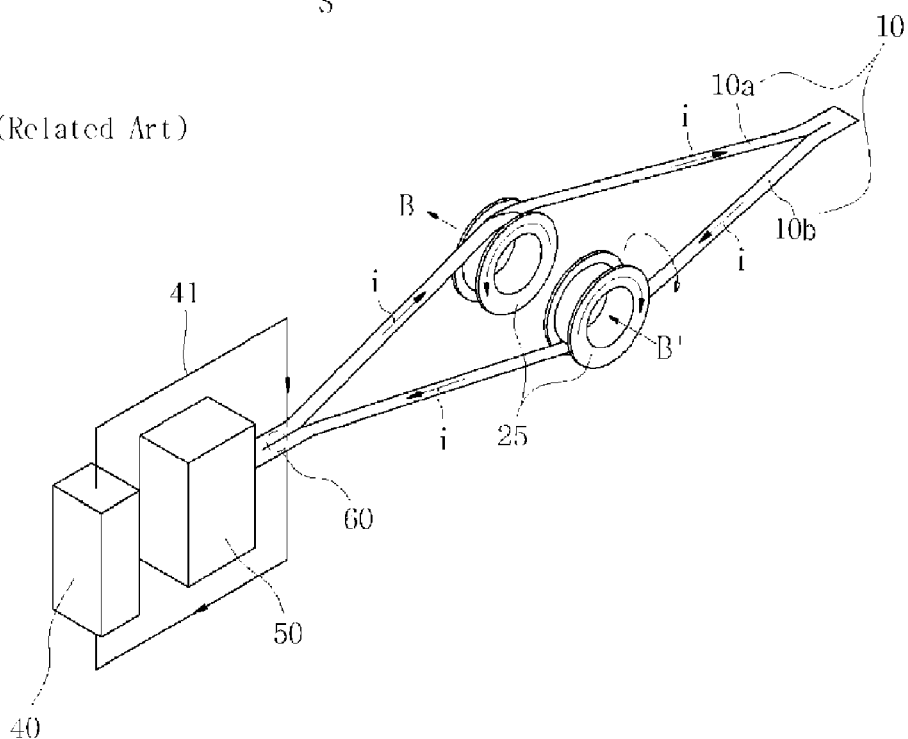
Figure 1C:
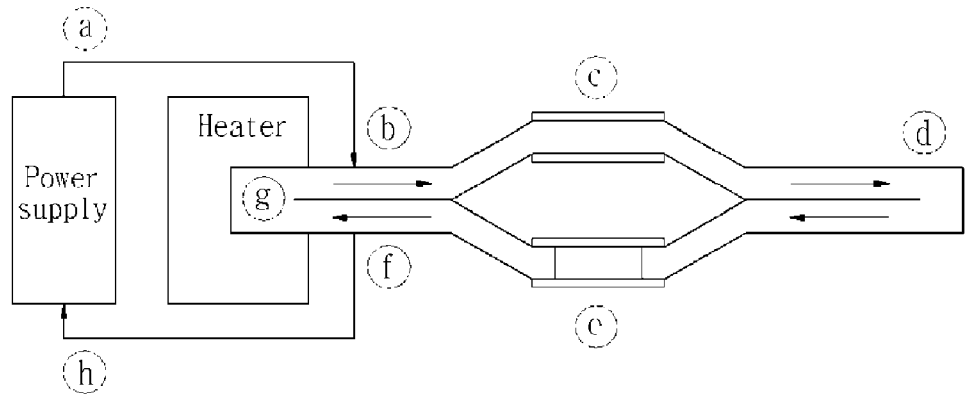
Figure 2:
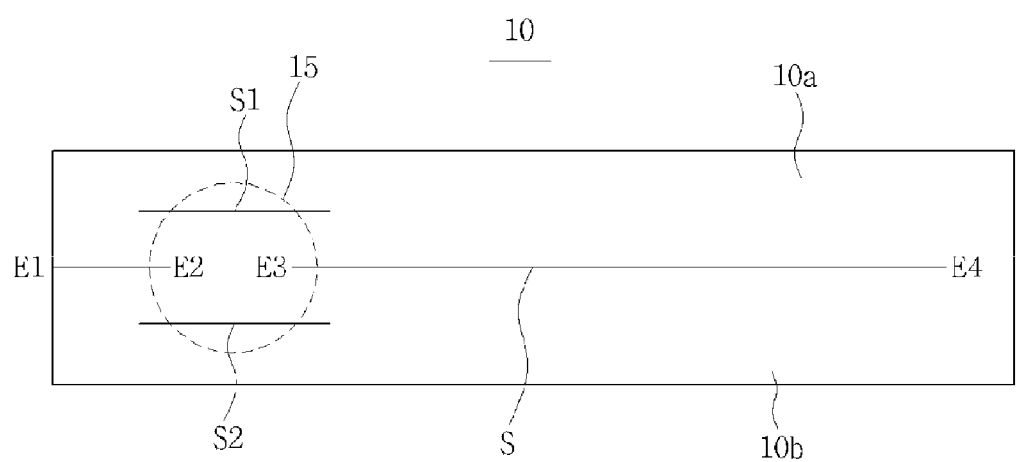
FIG. 2 is a view illustrating a persistent current switch according to the present invention.
Figure 3:
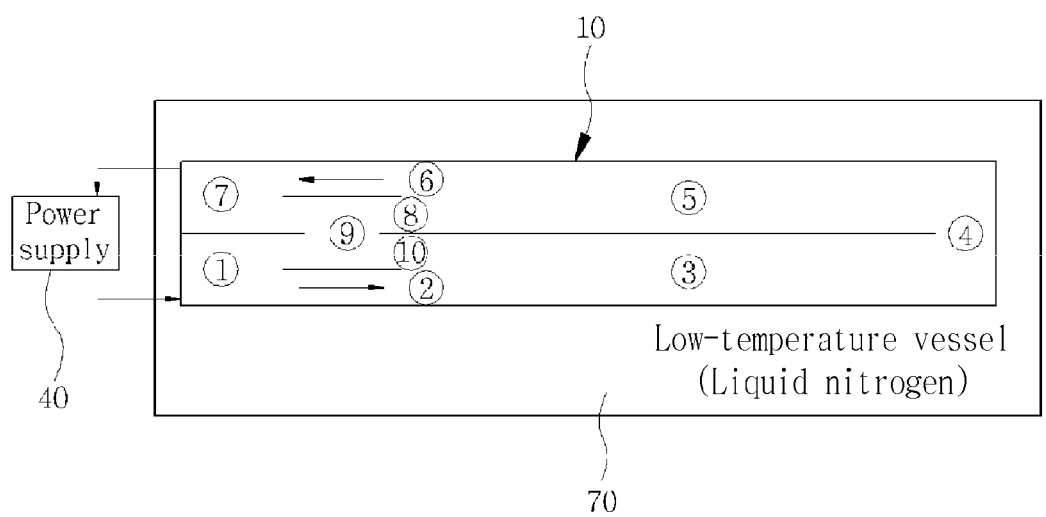
FIG. 3 is a view illustrating the superconducting current flow sequence of the persistent current switch according to the present invention.
Figure 6:
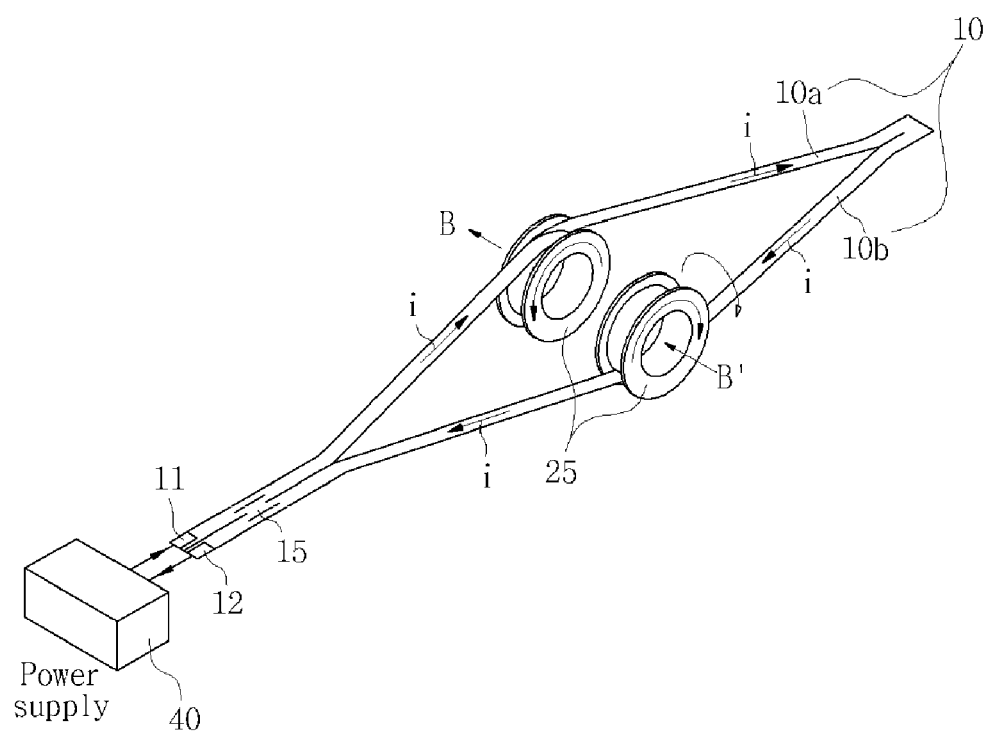
FIG. 6 is a view illustrating an embodiment using the persistent current switch according to the present invention.
Figure 7A:
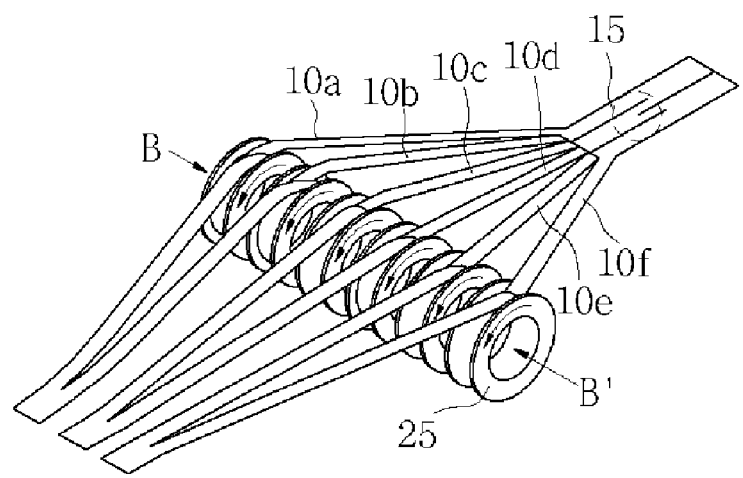
FIG. 7 is a view illustrating another embodiment of the persistent current switch using a plurality of wires according to the present invention.
Figure 7B:
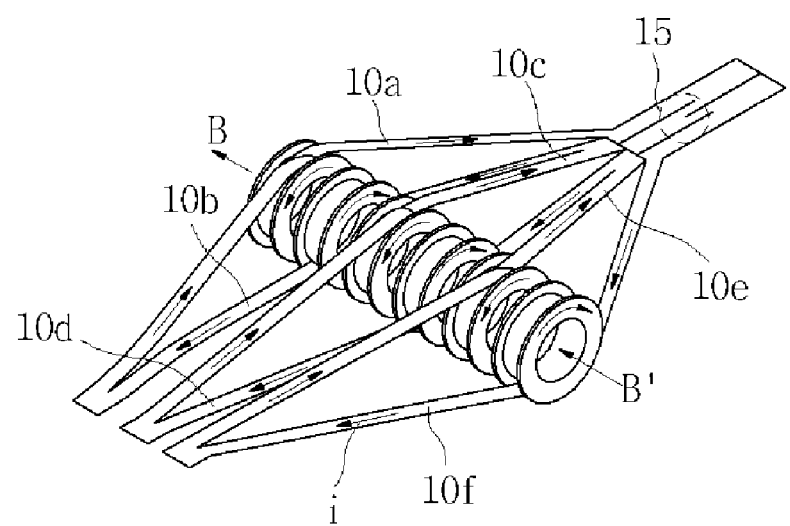

FIG. 2 is a view illustrating a persistent current switch according to the present invention. FIG. 3 is a view illustrating the superconducting current flow sequence of the persistent current switch according to the present invention. FIG. 4 is a view illustrating various shapes of the persistent current switch according to the present invention. FIG. 5 is a view illustrating a wedge type persistent current switch for a double pancake coil according to the present invention. FIG. 6 is a view illustrating an embodiment using the persistent current switch according to the present invention. FIG. 7 is a view illustrating another embodiment of the persistent current switch using a plurality of wires according to the present invention.

Now, constituent elements of the present invention will be described with reference to the accompanying drawings.

Referring to FIG. 2 illustrating a persistent current switch according to the present invention, the superconducting wire 10 has a first slit S longitudinally extending from a first point E1 on an end of the superconducting wire 10 to a second point E2 and from a third point E3 to a fourth point E4. Here, the second, third, and fourth points E2, E3, and E4 are located in the area of the superconducting wire 10 and are arranged sequentially in a line from the left to the right in the drawing. The superconducting wire 10 further has second and third slits S1 and S2 provided in a region between the second point E2 and the third point E3 where no first slit S exists. The second and third slits S1 and S2 are located at left and right sides of the first slit S, respectively, and have a length longer than a distance between the second point E2 and the third point E3. In this way, the superconducting wire 10 has a persistent current switch 15 formed with the slits S, S1, and S2.

Figure 8:
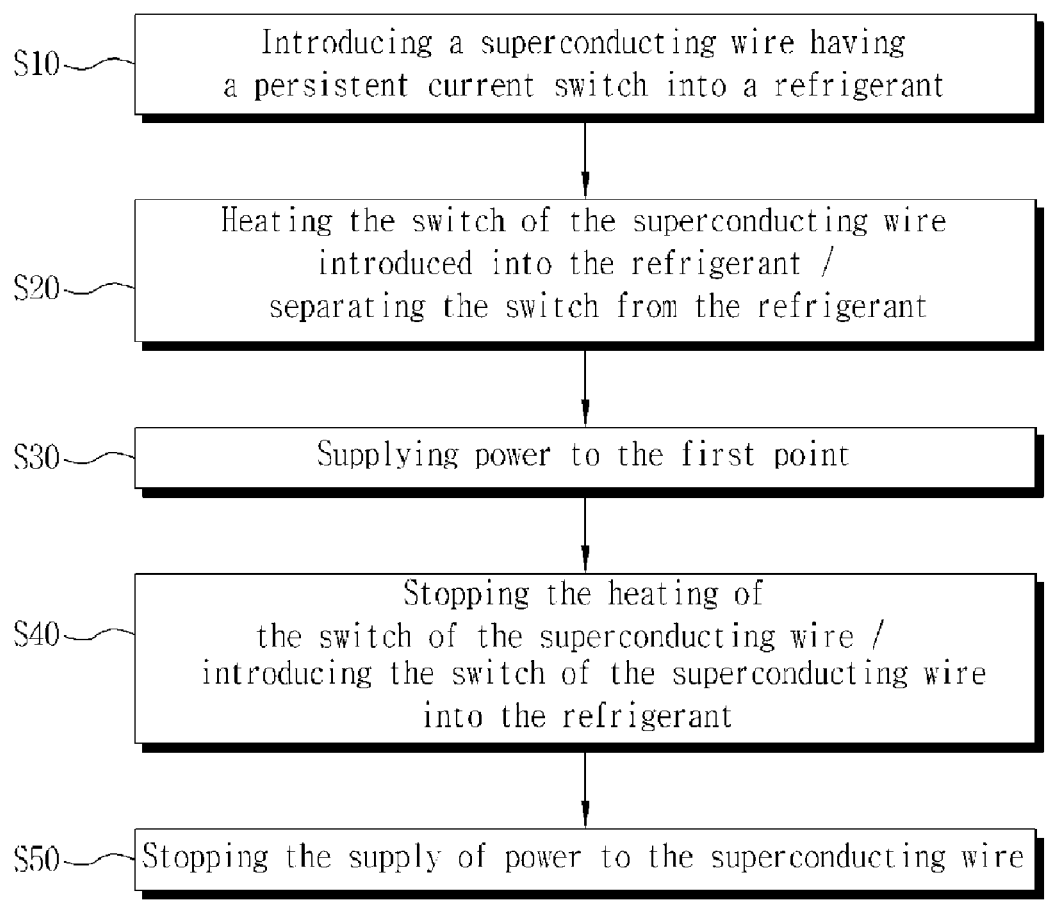
FIG. 8 is a view illustrating a control method for the persistent current switch according to the present invention.

Referring to FIG. 8, in a control method for the persistent current switch 15, first, the superconducting wire 10 having the switch 15 formed with the first, second, and third slits S, S1, and S2 is introduced into a refrigerant received in a low-temperature vessel 70 (operation S10). Then, the switch 15 of the superconducting wire 10 introduced into the refrigerant is heated or separated from the refrigerant, to become a normal conducting state (operation S20). In the normal conducting state of the superconducting wire 10, power is supplied to the first point E1 as a starting point of the first slit S formed in the superconducting wire 10, to apply current throughout the superconducting wire 10 (operation S30). Thereafter, the heating of the switch 15 of the superconducting wire 10 is stopped or the switch 15 of the superconducting wire 10 is again introduced into the refrigerant, to change the superconducting wire 10 from the normal conducting state to the superconducting state (operation S40). In this state, even if the supply of power to the superconducting wire 10 is stopped, the superconducting wire 10 can operate in the persistent current mode, and maintain a magnetic field (operation S50).

Referring to FIG. 3 illustrating the superconducting current flow sequence of the persistent current switch according to the present invention, in the normal conducting state of the superconducting wire 10 obtained by the above operation S20, the current flows from the power supply 40 to the superconducting wire 10 in the flow sequence of ①→②→③→④→⑤→⑥→⑦, and then, returns to the power supply 40. On the other hand, during the operation S50 of stopping the supply of power and maintaining a magnetic field, the current flows through the superconducting wire 10 in the sequence of ③→④→⑤→⑧→⑨→⑩. The above described flow sequence of current creates a closed loop, thereby providing the superconducting wire 10 with the persistent current mode for maintaining a magnetic field.

FIG. 4 illustrates various shapes of the persistent current switch according to the present invention. More specifically, in FIGS. 4A to 4D, the superconducting wire 10 has a relatively large width such that a plurality of wires 10a, 10b, 10c, 10d, 10e, and 10f can be formed therein according to the position and width of the slits S, S1, and S2. Accordingly, the superconducting wire 10 can be fabricated to have various shapes according to the position of the switch 15, and the current (i) can flow along a closed loop determined by the position of the switch 15.

Figure 5A:
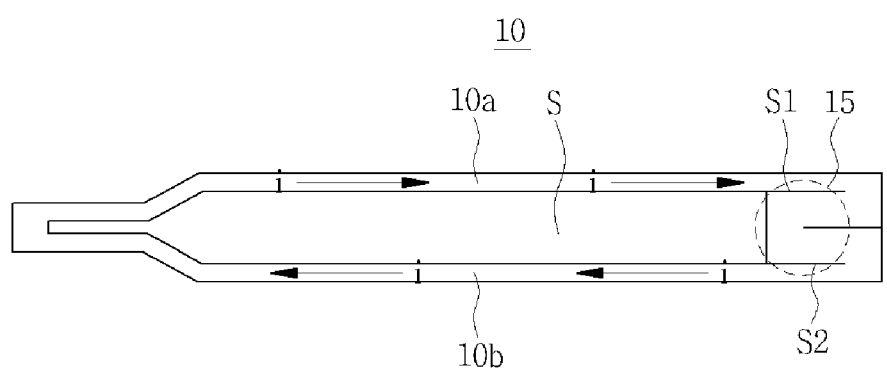
FIG. 5 is a view illustrating a wedge type persistent current switch for a double pancake coil according to the present invention.
Figure 5B:
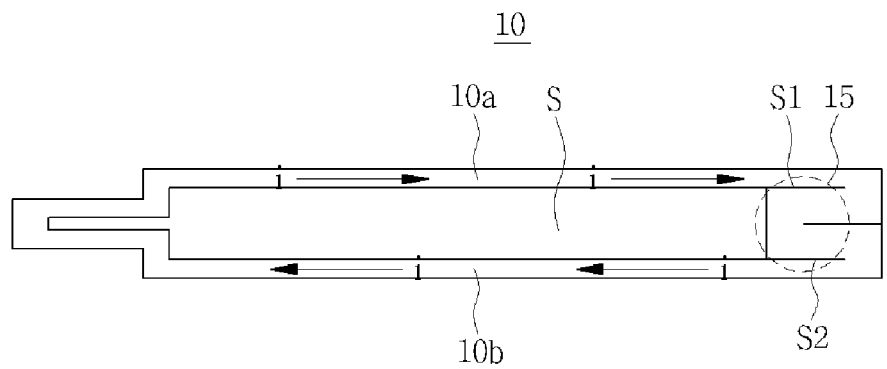

FIG. 5 illustrates a wedge type persistent current switch for a double pancake coil according to the present invention. As shown in FIGS. 5A and 5B, the superconducting wire 10 may have a unitary body having slits S, S1, and S2.

FIG. 6 is a view illustrating an embodiment using the persistent current switch according to the present invention. In use, bobbins 25 are provided at the middle of the superconducting wire 10 consisting of the two superconducting wires 10a and 10b as shown in FIG. 2, such that the superconducting wire 10 is wound, in a direction, around the bobbins 25. In this case, magnetic fields B and B' produced by the respective superconducting wires 10a and 10b around the bobbins 25 have opposite directions from each other. When any one of the bobbins 25, around which the superconducting wires 10a and 10b are wound, is turned upside down, a pancake coil as shown in FIG. 6 can be finally obtained to produce magnetic fields B and B' having the same direction as each other.

One end of the superconducting wire 10 formed with the switch 15 is provided with junctions 11 and 12 to be connected with the power supply 40.

FIG. 7 is a view illustrating another embodiment of the persistent current switch using a plurality of wires according to the present invention. As shown in FIG. 7, when the superconducting wire 10 having a relatively large width is divided into a plurality of wires, the superconducting wire 10 can operate in a persistent current mode without a resistance. The manufacturing process of the plurality of pancake coils is identical to that as described with reference to FIG. 6.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

As apparent from the above description, in the structure of a persistent current switch and a control method for the same according to the present invention, a superconducting wire is formed, at a portion thereof to be used as a switch, with at least one slit. By controlling the flow of current by use of the switch formed with the slit, the present invention has the effect of assuring an easy transition between the superconducting state and the normal conducting state of the superconducting wire.

The invention claimed is:

1. A persistent current switch, comprising:
   a first slit (S) longitudinally extending from a first point (E1) on one end of a superconducting wire to a second point (E2) and from a third point (E3) to a fourth point (E4), the second, third, and fourth points (E2), (E3), (E4) being arranged sequentially in a longitudinal line; and
   second and third slits (S1), (S2) provided at opposite sides of a region between the second point (E2) and the third point (E3) where no first slit exists, the second and third slits (S1), (S2) having a length longer than a distance between the second point (E2) and the third point (E3).

2. A control method for a persistent current switch comprising:
   (step S10) of introducing a superconducting wire having a persistent current switch into a refrigerant, the persistent current switch of the superconducting wire including a first slit (S) longitudinally extending from a first point (E1) on one end of a superconducting wire to a second point (E2) and from a third point (E3) to a fourth point (E4) the second, third, and fourth points (E2), (E3), (E4) being arranged sequentially in a longitudinal line, and second and third slits (S1), (S2) provided at opposite sides of a region between the second point (E2) and the third point (E3) where no first slit exists, the second and third slits (S1), (S2) having a length longer than a distance between the second point (E2) and the third point (E3);
   (step S20) of heating the persistent current switch of the superconducting wire introduced into the refrigerant or separating the persistent current switch from the refrigerant, to change the superconducting wire into a normal conducting state;
   (step S30) of supplying power to the first point (E1) as a starting point of the first slit formed in the superconducting wire, to apply current throughout the superconducting wire;
   (step S40) of stopping the heating of the persistent current switch of the superconducting wire or introducing the persistent current switch of the superconducting wire into the refrigerant; and
   (step S50) of stopping the supply of power to the superconducting wire, to allow the superconducting wire to operate in a persistent current mode so as to maintain a magnetic field.

3. The control method according to claim 2, wherein, in the normal state of the superconducting wire obtained by step S20 of heating the persistent current switch or separating the persistent current switch from the refrigerant, current flows from a power supply to the superconducting wire in the sequence of ①→②→③→⑤→⑥→⑦, and then, returns to the power supply.

4. The control method according to claim 2, wherein, in the step S5O of stopping the supply of power and maintaining the magnetic field, current flows through the superconducting wire in the sequence of ③→④→⑤→⑧→⑨→⑩.

* * * * *